US011464115B2

(12) United States Patent
Abergel et al.

(10) Patent No.: US 11,464,115 B2
(45) Date of Patent: Oct. 4, 2022

(54) METHOD FOR DEPOSITING FUNCTIONAL TRACES

(71) Applicants: MGI DIGITAL TECHNOLOGY, Fresnes (FR); INKJET ENGINE TECHNOLOGY, Meudon (FR)

(72) Inventors: Edmond Abergel, Paris (FR); Louis Gautier Le Boulch, Meudon (FR); Clement Beges, Maisons-Alfort (FR)

(73) Assignees: MGI DIGITAL TECHNOLOGY, Fresnes (FR); INKJET ENGINE TECHNOLOGY, Meudon (FR)

( * ) Notice: Subject to any disclaimer, the term of this patent is extended or adjusted under 35 U.S.C. 154(b) by 620 days.

(21) Appl. No.: 16/492,001

(22) PCT Filed: Mar. 8, 2018

(86) PCT No.: PCT/EP2018/055819
§ 371 (c)(1),
(2) Date: Sep. 6, 2019

(87) PCT Pub. No.: WO2018/162669
PCT Pub. Date: Sep. 13, 2018

(65) Prior Publication Data
US 2020/0323084 A1 Oct. 8, 2020

(30) Foreign Application Priority Data
Mar. 9, 2017 (EP) .................................... 17305254

(51) Int. Cl.
*H05K 1/09* (2006.01)
*H05K 1/11* (2006.01)
(Continued)

(52) U.S. Cl.
CPC ......... *H05K 3/046* (2013.01); *G06K 19/0723* (2013.01); *H05K 2203/013* (2013.01);
(Continued)

(58) Field of Classification Search
CPC ... H05K 1/09; H05K 1/11; H05K 1/16; H05K 1/092; H05K 3/00; H05K 3/02;
(Continued)

(56) References Cited

U.S. PATENT DOCUMENTS 4,288,282 A * 9/1981 Brown .................. G03F 7/0007
430/394
4,353,952 A * 10/1982 Brown ..................... C23F 1/02
428/209
(Continued)

FOREIGN PATENT DOCUMENTS

| CA | 2089060 A1 | 8/1994 |
| EP | 0414362 A2 | 2/1991 |
| EP | 1736324 A2 | 12/2006 |

OTHER PUBLICATIONS

International Search Report and Written Opinion dated May 15, 2018, in related PCT Application No. PCT/EP2018/055819.

*Primary Examiner* — Xiaoliang Chen
(74) *Attorney, Agent, or Firm* — Maschoff Brennan

(57) ABSTRACT

The present invention relates to a printing method comprising a step of printing a pattern on a substrate, preferably by ink jet printing, followed by a gold plating step by means of contact between the pre-printed pattern to be gold plated and a gold plating deposition device, such as a preferably conductive metal sheet, e.g. a multilayer film comprising a preferably conductive metal sheet.

20 Claims, 2 Drawing Sheets

(51) Int. Cl.
　　　*H05K 1/16*　　(2006.01)
　　　*H05K 3/00*　　(2006.01)
　　　*H05K 3/02*　　(2006.01)
　　　*H05K 3/10*　　(2006.01)
　　　*B32B 3/00*　　(2006.01)
　　　*B44C 1/10*　　(2006.01)
　　　*B44C 1/14*　　(2006.01)
　　　*B44C 1/17*　　(2006.01)
　　　*G03G 9/13*　　(2006.01)
　　　*G03G 9/16*　　(2006.01)
　　　*G03G 13/22*　　(2006.01)
　　　*H05K 3/04*　　(2006.01)
　　　*G06K 19/07*　　(2006.01)
(52) U.S. Cl.
　　　CPC ............... *H05K 2203/0156* (2013.01); *H05K 2203/0522* (2013.01); *H05K 2203/1545* (2013.01)
(58) Field of Classification Search
　　　CPC .......... H05K 3/10; H05K 3/125; H05K 3/386; H05K 3/1283; H05K 3/027; H05K 3/046; H05K 3/064; H05K 3/079; H05K 2203/013; H05K 2203/0156; H05K 2203/0522; H05K 2203/0545; B32B 3/00; G03G 9/13; G03G 9/16; G03G 13/22; G06K 19/0732
　　　USPC ............ 156/277, 230, 233, 234, 249, 272.2; 174/257, 260, 261; 428/32.39, 40.1, 428/195.1, 199, 201, 212, 335, 347, 354, 428/421, 913; 430/5, 23, 49.31, 96, 430/109.3, 124.13, 325, 327, 328, 394
　　　See application file for complete search history.

(56) References Cited

U.S. PATENT DOCUMENTS

| | | | | |
|---|---|---|---|---|
| 4,484,970 A | | 11/1984 | Burzlaff et al. | |
| 5,128,224 A | * | 7/1992 | Ohtake | H01J 9/142 355/87 |
| 5,164,245 A | * | 11/1992 | Suzuki | B44C 1/14 428/209 |
| 5,260,153 A | * | 11/1993 | Ohtake | H01J 9/142 430/5 |
| 5,264,279 A | * | 11/1993 | Imamura | B41M 5/42 428/327 |
| 5,597,672 A | * | 1/1997 | Kato | G03G 13/283 430/96 |
| 5,648,191 A | * | 7/1997 | Kato | G03G 13/286 430/49.31 |
| 11,104,103 B2 | * | 8/2021 | Salant | B32B 27/08 |
| 2003/0194523 A1 | * | 10/2003 | Kume | G09F 3/10 428/354 |
| 2005/0025946 A1 | * | 2/2005 | Sato | H05K 3/064 428/335 |
| 2005/0167035 A1 | * | 8/2005 | Laskey | B44C 1/105 156/233 |
| 2007/0295448 A1 | * | 12/2007 | Mansukhani | B44C 1/1712 156/277 |
| 2008/0047930 A1 | * | 2/2008 | Blanchet | B82Y 10/00 438/758 |
| 2008/0083484 A1 | * | 4/2008 | Blanchet | B82Y 10/00 75/710 |
| 2010/0078209 A1 | * | 4/2010 | Inoue | H05K 3/125 174/257 |
| 2011/0048779 A1 | * | 3/2011 | Karasawa | H01L 21/561 525/185 |
| 2012/0094090 A1 | * | 4/2012 | Yamazaki | H05K 3/046 977/890 |
| 2012/0264045 A1 | * | 10/2012 | Matsushima | G03G 15/6591 430/124.13 |
| 2017/0135220 A1 | * | 5/2017 | Chadalavada | H05K 3/027 |
| 2017/0320253 A1 | * | 11/2017 | Salant | B32B 7/12 |
| 2017/0361572 A1 | * | 12/2017 | Salant | B32B 27/302 |
| 2018/0196346 A1 | * | 7/2018 | Son | H05K 1/09 |
| 2018/0257341 A1 | * | 9/2018 | Salant | B32B 27/10 |
| 2019/0121279 A1 | * | 4/2019 | Tzomik | G03G 15/10 |
| 2019/0137898 A1 | * | 5/2019 | Skvirsky | G03G 8/00 |
| 2019/0193380 A1 | * | 6/2019 | Salant | B32B 15/085 |
| 2019/0218007 A1 | * | 7/2019 | Idan | B32B 37/04 |
| 2019/0219940 A1 | * | 7/2019 | Salant | G03G 7/00 |
| 2019/0322095 A1 | * | 10/2019 | Salant | B32B 37/153 |

* cited by examiner

METHOD FOR DEPOSITING FUNCTIONAL TRACES

FIELD OF THE INVENTION

The present invention relates to a method for depositing functional traces, for example conductive traces, on a substrate. Thus, the invention relates in particular to a method for depositing functional traces, for example conductive traces, on a substrate by depositing an additional coating (or material), generally referred to as "gilt", on the substrate. In particular, the present invention relates especially to a method of printing comprising a step of printing a pattern on the substrate, preferably by inkjet printing, followed by a step of "gilding" by means of contact between the pre-printed pattern to be gilded and a device for depositing "gilt", such as a preferably conductive metal foil, for example a multilayer film comprising a preferably conductive metal foil.

BACKGROUND

Techniques for gilding a substrate, for example a printed substrate, are well known to those skilled in the art. The basic principle of this technique is based on the depositing of an additional coating (i.e. gilt or material) on the substrate, by means of a device for depositing "gilt", for example by applying/pressing a foil (bearing said coating or gilt) onto selected areas of the substrate in such a way as to cause the desired portion of the foil to adhere to the selected areas. This technique can for example comprise a deposition of adhesive on the substrate according to a predetermined pattern, before the deposition of the customizing coating (for example the gilt foil) on the adhesive deposited on the substrate. The deposition of the adhesive can be carried out by means of one or more techniques, such as for example inkjet printing, toner-based printing, screen printing or offset printing.

For example, patent application EP 0414362-A2 relates to the formation of electrical traces on a substrate, and more particularly the formation of electrical traces on a substrate by means of a step of forming a circuit pattern by inkjet printing, followed by a step of applying a thin metal layer on said pattern.

Patent application CA 2089060 describes the application of a colored or metal foil on toner printed on a substrate, such as paper, at high speed, in a versatile manner, using a rotary printing roll and a rotary transfer roll having heated raised portions spaced out circumferentially. The toner, which preferably comprises a thermoplastic component, is applied to the paper with a suitable printer, such as a computer-controlled MIDAX print engine (ionic deposition). The toner may be heated by infrared just before the paper is fed to the line of contact between the printing and transfer rolls. The heat and the pressure applied at the interstice transfer the adhesive and the aluminum paper from the aluminum strip onto the sticky toner, producing the desired printed paper.

Application EP 1736324 describes a method which consists in providing a digital data record characterizing a sample and digitally pressing an adhesion agent with the sample on a surface of a substrate (1) using said record. A metallic or metallized layer is brought into contact with the surface. The adhesion agent is activated to glue the layer with the surface in a sampling area. The layer is then withdrawn, and the glued areas stay behind on the substrate.

The gilding technique is generally optimized so as to promote better performance levels in terms of attachment of the gilt foil on the substrate while at the same time improving the quality and more particularly the fineness of the gilt deposit on the substrate. Despite the progress and the precision of gilding techniques, the applicant has noted that it is very difficult to reconcile these two conditions with known gilding techniques. One of the objectives of the present invention thus consists in providing a gilding technique which promotes better performance levels in terms of attachment of the gilt foil to the substrate while at the same time improving the quality and more particularly the fineness of the gilt deposit on the substrate.

Furthermore, none of the current techniques to date meets the requirements of printed electronics, this being for many reasons, among which mention will be made, by way of illustration, of:

- insufficient precision of the pre-printed pattern which results in an imprecision of the conductive traces during the deposition thereof;
- a pre-printed pattern of which the adhesive properties are insufficient during the application of the gilt;
- an imperfect adhesion between the pre-printed pattern and the gilt foil, which leads to defects in the circuit and thus a decrease, or even an absence, of conductivity;
- an adhesion of the surface of the gilt foil on the substrate outside the pre-printed pattern;
- a partial detachment of the conductive layer during the removal of the gilt foil;
- an insufficient thickness of the metal layer of the gilt foil which does not make it possible to obtain the necessary conductivity levels;
- the presence of insulating layers contaminating the surface of the metal layer during the transfer onto the substrate, which leads to an absence of conductivity;
- too great a thickness of the gilt foil transport layer which causes imperfect deposits of the gilt traces on the pre-printed pattern;
- etc.

Finally, no technique currently makes it possible to print, in a customizable and unique manner, conductive traces and insulating traces in a single pass in a printing machine in order to satisfy certain particularities of printed electronics (for example bridge, condenser, etc.).

The present invention thus aims to provide solutions which make it possible to overcome these major drawbacks of the prior art.

DETAILED DESCRIPTION

Figure 1:
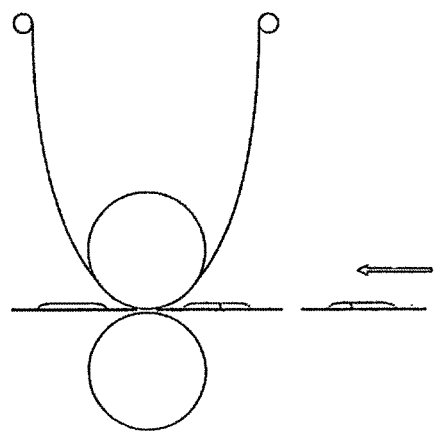
FIGS. 1 to 3 illustrate some embodiments of the present invention.

The present invention relates to and claims a method for depositing traces of functional material, preferably conductive traces, on a substrate in a printing machine comprising a printing station followed by a film-applying station, comprising the following steps:

a. providing the substrate,
b. printing a printing product according to a pattern on the substrate,
c. providing a film comprising at least one application film coating comprising a material B, a functional material film coating, and a transport layer, d. applying, in the applying station, the film onto the substrate under pressure and temperature conditions leading to the selective co-adhesion between the pattern printing product and the film application film coating, e. removing the film from the substrate, e.1. the substrate comprising the film application film coating co-adhered to the pattern printing product and thus forming the traces of functional material according to said pattern, e.2. the remainder of the functional film coating, and preferably of the application film coating, being recovered with the film removed, characterized in that the printing product comprises a thermoplastic material A and, optionally, a thermosetting material, the material B of the application film coating is thermoplastic, the materials A and B each have a glass transition temperature Tg, and the conditions of step d are such that the Tgs of each of the materials A and B are achieved and that chemical bonds are created between the materials A and B.

The glass transition temperature Tg can be measured by any suitable method. By way of illustration, mention will be made of differential scanning calorimetry (DSC), which is a thermal analysis method widely recognized in the sector for measuring various transition temperatures and states.

By way of illustration, the polymer sample will be subjected to an increasing temperature gradient of about 10° C./min, the heat flux of which is measured in watts. The glass transition temperature marks the passing of the material from the vitreous state to the rubbery state, which is an endothermic phenomenon. Consequently, to define the value of the Tg, it is sufficient to wait for the observation of a decrease in the heat flux as a function of the temperature, then to use a tangential method. The value obtained corresponds to the Tg of the polymer.

Without wishing to be restricted by this explanation, the applicant thinks that the combination of these method/material features makes it possible to meet the objectives mentioned above in the description; by way of illustration, the particular choice of the materials A (as component of the printing product (for example an ink, a varnish and/or a toner)) and B (as component of the application film coating) represents an essential feature of the invention since this choice brings about a thermoplastic behavior of the application film coating and of the printing product when they are brought into contact.

Furthermore, the method claimed differs from the prior art by virtue of its flexibility of use and by virtue of a reduction in the manufacturing time and also in the corresponding costs, which make it particularly attractive, in particular for printed electronics, for example the fabrication of printed circuits.

The present invention relates in particular to techniques for relief inkjet printing of the printing pattern, for example by means of piezoelectric printing heads, adjusted as a function of the printing product (for example of the printing ink and/or varnish used).

The films used in the context of the present invention comprise at least one application film coating comprising a thermoplastic material B, a functional material film coating and a transport layer. Those skilled in the art regularly refer to this type of film by the expression "gilding foil". Thus, the gilding foils (films) used in the context of the present invention consist of several superimposed film coatings comprising, by way of nonlimiting example:

an application film coating comprising a material B,
 at least one film coating of functional material, for example of gilt, preferably of conductive gilt,
 an optional protective film coating,
 an optional release film coating, and
 at least one transport layer which allows the transport of the other layers.

It is obvious for those skilled in the art that the words "gilding" and "to gild" used in the present invention are not limited to the use of gold foil and that any "gilding" device can be used. These terms of course cover all types of decorative foils (sometimes also referred to as metal foils) among which mention may be made, by way of illustrative and nonlimiting examples, of aluminum, chromium, gold, silver, copper or even optically active metal salts. In general, a gilt foil pressed against the substrate to be customized is used, and the present application thus denotes, by means of this term, the general use of a gilding device. However, in order to avoid any interpretation problem, the applicant has preferred to use the word "film" (comprising, inter alia, a functional material film coating) in the present description and in the claims.

Figure 2:
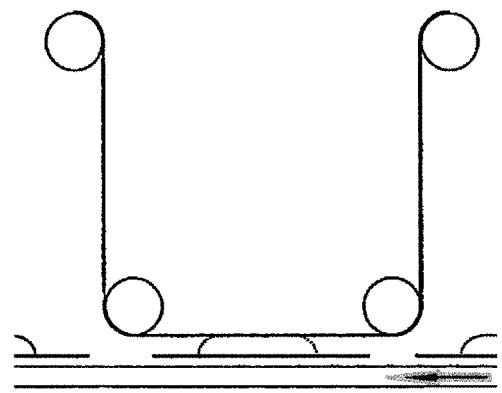
Figure 3:
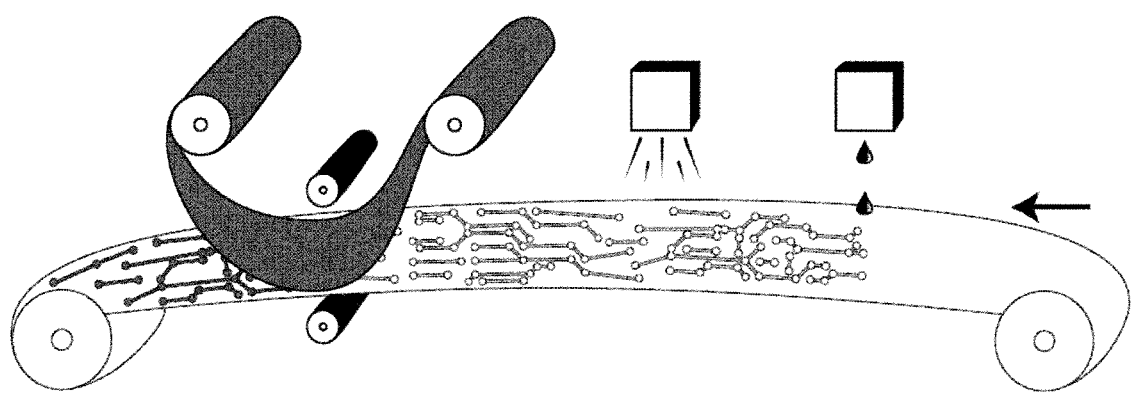

FIGS. 1 to 3 illustrate some embodiments of the present invention.

The step of applying the film on the substrate under pressure and temperature conditions which result in selective co-adhesion between the printing product and the film application film coating (in particular between the material A of the printing product and the material B of the film application film coating) can be carried out according to any suitable method. By way of illustration, mention will be made of the use of one or more sets of pinching rollers as described in FIG. 1;
 of one or more pressing rollers as described in FIG. 2.

FIG. 3 illustrates an embodiment of the method according to the present invention with the printing station followed by the film deposition station.

Film—Composition and Properties

The films used in the context of the present invention preferably consist of several superimposed film coatings comprising, by way of nonlimiting and nonexhaustive example, in the order of attachment to the substrate to be covered:

an application film coating comprising a material B,
 followed by at least one film coating of functional material, for example of gilt, preferably of conductive gilt,
 followed by an optional protective film coating,
 followed by an optional release film coating, and
 finally followed by at least one transport layer which thus allows the transport of the other layers.

The films used in the context of the present invention are generally provided in the form of rolls with a width substantially equivalent to the transverse dimension of the substrate.

Transport Layer

The transport layer allows the transport of the other constituent layers of the film and, in particular, of the film coating of functional material and of the application film coating in accordance with the present invention. Its role is thus mainly that of conveying the other constituent layers of the film to the final deposition of the application film coating and of the film coating of functional material that are in accordance with the present invention.

The thickness of this layer is generally between 5 and 50 µm. A greater thickness has a tendency to limit the heat transfer harming the degree of transfer. A smaller thickness leads to numerous difficulties in tension management. By way of nonlimiting illustration, the transport layer may be composed of polyester (PET) films. The latter may be co-extruded, may have various structures, may be surface-treated, etc.

The surface treatments can involve corona, plasma, silicone, acrylic, polyester, etc.

Depending on their nature, PET films will allow more or less effective spreading and also a different adhesion with the lower layers of the film.

Release Film Coating

The release film coating (optional but preferred) (or release layer) makes it possible to optimize the release of the transport layer from the remainder of the film during its use. The basis weight of this film coating is not generally quantifiable since its thickness is preferably less than 0.1 μm.

During the application of a certain temperature and pressure, the exceeding of its melting point will fluidize and vaporize a portion of the layer, thus creating a release. Depending on its nature, traces of the release film coating will be either on the transport layer (for example the PET), or on the surface of the layer located below, or on the two layers.

In the present invention, the remainders of the release film coating will preferentially be on the transport layer (for example the PET) so as not to contaminate the surface of the film coating of functional material. In one particular embodiment according to the present invention, the release film coating comprises and/or consists of electrically conductive material, for example of conductive polymers; indeed, in this particular embodiment, any contamination of the film coating of functional material by the release film coating will have no harmful influence on the desired conductivity.

The release film coating may also advantageously comprise or consist of solvent-soluble waxes, waxes in emulsion, natural waxes, silicone waxes and/or synthetic waxes, etc.

By way of nonlimiting illustration, the release film coating may be coated by means of the conventional printing techniques, such as photogravure or reverse photogravure, and/or flexography, etc.

Protective Film Coating

The (optional) protective film coating is also referred to as lacquering film coating and/or coloring film coating (since it can also comprise any type of dye and/or pigment and/or matting or sheen agent). This protective film coating can be characterized by numerous properties as a function of the desired use, whether they are chemical and/or physical resistance properties. This film coating is most often composed of two-component varnish, of acrylic resins, of polyester resins, of hydroxylated resins, and/or of cellulose-based derivatives, etc. All these families of constituent materials of the protective film coating are in general organic polymers which are thus considered to be insulators. Thus, according to one particular embodiment of the present invention, the film does not comprise a protective film coating in order to preserve the conductive features of the film coating of functional material and to thus avoid the insulation thereof. In one particular embodiment according to the present invention, the protective film coating comprises and/or consists of electrically conductive material, for example of conductive polymers; indeed, in this particular embodiment, the protective film coating will have no harmful influence on the desired conductivity. Usually, the thickness of this layer is most often around values of between 2 μm and 3 μm.

All commercial films have a protective layer based on nonconductive polymers which makes them unsuitable for use thereof in any application wherein conductivity is desired, since the result of this is that it is impossible to circulate electric current.

By way of nonlimiting illustration, the protective film coating may be coated by means of conventional printing techniques, such as photogravure or reverse photogravure, and/or flexography, etc.

Film Coating of Functional Material

In one particular embodiment according to the present invention, the principal role desired for the film coating of functional material is its conductivity. The latter must in fact reach values suitable for the printed electronics market. By way of illustration, the film coating of functional material can be characterized by a sheet resistance of less than 1 Ω/sq. (ohm squared), which is particularly relevant for the OLED field. This sheet resistance can be measured by any appropriate method; by way of illustration, mention will be made of the four-point method which makes it possible to perform this measurement using a generator which sends a current between points 1 and 4, and the voltage circulating between points 2 and 3 is simultaneously measured. It is then sufficient to apply Ohm's Law Voltage=Resistance× Intensity in order to obtain the resistance between points 2 and 3.

This film coating can thus advantageously comprise and/or consist of any electrically conductive material. For example, this film coating may be composed of various metals deposited by means of several techniques, such as sputtering, E-beam, and/or vacuum thermal evaporation, etc. The candidate metals for such an application are by way of illustration copper, silver, tin, chromium, gold, aluminum and/or alloys, etc.

Thus, according to one preferred embodiment of the present invention, the functional material of the film coating of functional material is electrically conductive; it may advantageously comprise and/or consist of copper and/or silver, and/or tin and/or chromium and/or gold and/or aluminum, and/or conductive alloys.

The thickness of the film coating of functional material in a commercial film is generally below 100 nm. In one particular embodiment according to the present invention, the film coating of functional material has a thickness of at least 200 nm, for example at least 500 nm, in order to ensure an acceptable conductivity; in general, said thickness has an upper limit of 3 μm, although greater thicknesses can be envisioned. Increasing the thickness of the film coating of functional material can effectively cause problems of brittleness of the film since the metal material is not as flexible as the organic matrix making up a polymer.

In one particular embodiment according to the present invention, the film coating of functional material consists of conductive polymers. In this variant, its thickness will preferably range between 1 μm and 3 μm in order to ensure a minimal conductivity. By way of nonlimiting illustration, the film coating of functional material of conductive polymers can be coated by means of conventional printing techniques, such as photogravure or reverse photogravure, and/or flexography, etc.

In one particular embodiment according to the present invention, the film coating of functional material is characterized by a resistance of less than 100Ω, for example less than 50Ω, and preferably less than 5Ω. This resistance can be measured by any appropriate method; by way of illustration, mention will be made of the use of a multimeter in ohm mode. This makes it possible to measure the resistance of a surface.

Application Film Coating

The application film coating which is generally absent in most of the film applications known to date in the field of the gilding of pre-printed patterns carried out under cold conditions is essential in the present invention. Its thickness is generally between 2 and 10 μm.

An essential feature of the present invention lies in the fact that the application film coating comprises and/or consists of a thermoplastic material B, for example one or more thermoplastic polymers. In one particular embodiment according to the present invention, the application film coating comprises at least 50% by weight of the thermoplastic material B, for example at least 70% by weight, preferably at least 80% by weight. This thermoplastic material B may consist of one or more thermoplastic chemical components, for example two or more thermoplastic resins/polymers.

According to one particular embodiment of the present invention, the application film coating thus comprises a matrix of thermoplastic material B (for example of thermoplastic polymer B) and is characterized by a glass transition temperature Tg such that this film coating is
- dry to the touch at ambient temperature, and
- heat-reactivatable, that is to say that it has a thermoplastic behavior starting from which the application film coating (and, a fortiori, the material B that it contains) will become ductile/malleable and will thus develop a surface adhesion property when the treatment temperature (and in particular the application temperature during the step of application of the film in the film-applying station) is greater than this Tg.

Thus, in one particular embodiment of the present invention, the thermoplastic material B is characterized by a Tg value of between 0° C. and 200° C., for example between 40° C. and 130° C., for example between 60° C. and 130° C., for example between 80° C. and 120° C. If the thermoplastic material B consists of a homogeneous mixture of two or more thermoplastic chemical components, the individual Tg value of each of these components will not be critical provided that the Tg of the mixture indeed corresponds to the desired values; thus, the thermoplastic material B may tolerate thermoplastic components having Tgs of less than 40° C., or even less than 0° C. and/or greater than 80° C., or even greater than 130° C., provided that the Tg of said material is included within the range of ideal values.

Thus, in one preferred embodiment of the present invention, the thermoplastic material B is characterized by a Tg value of between 40° C. and 80° C.

In one particular embodiment of the present invention, in addition to the material B, the application film coating may also comprise other materials, such as for example inert materials (for example inorganic fillers). Since these other materials generally have little influence on the Tg of the whole material constituting the application film coating, the Tg of said application film coating is very close to that of the material B.

In one particular embodiment of the present invention, the application film coating is characterized by a Tg value of between 0° C. and 200° C., for example between 40° C. and 130° C., for example between 60° C. and 130° C., for example between 80° C. and 120° C. The measurement of the Tg of the application film coating will advantageously be carried out by means of the DSC method indicated above in the description—the sample used for the measurement may advantageously originate from the material constituting the application film coating before the manufacture of the corresponding film. In one preferred embodiment of the present invention, the application film coating is characterized by a Tg value of between 40° C. and 80° C.

According to one particular embodiment of the present invention, the matrix of thermoplastic polymer (the material B) of the application film coating has a particular affinity with the material A of the printing product. This affinity can be reflected in various ways, of which the following are mentioned by way of illustration:
- the fact that the material B contains and/or consists of one (or more) resin(s) belonging to a chemical nature which is also present in the material A of the printing product; by way of nonlimiting illustration, this chemical nature will be selected from a nucleophilic group (comprising oxygen and/or nitrogen), a hydroxyl group and/or a nitrogenous group; and/or
- that at least one of the resins is present both in the material B of the application film and in the material A of the printing product and is an acrylic resin, for example a similar and/or identical acrylic resin; and/or
- that at least one of the resins is present both in the material B of the application film and in the material A of the printing product and is a ketone resin, for example a similar and/or identical ketone resin; and/or
- that at least one of the resins is present both in the material B of the application film and in the material A of the printing product and is an aldehyde resin, for example a similar and/or identical aldehyde resin; and/or
- that at least one of the ingredients is present both in the material B of the application film and in the material A of the printing product and is of cellulose-based type: for example, an ingredient consisting of cellulose acetate propionate and/or of cellulose acetate butyrate and/or of cellulose acetate and/or of nitrocellulose.

According to one particular embodiment of the present invention, the matrix of thermoplastic polymer (the material B) of the application film coating may be a solvent-phase or an aqueous-phase polymer.

Without wanting to be restricted by this explanation, the applicant thinks that this common portion between at least one of the components of the material A and one of the components of the material B will make it possible to create a chemical affinity between these two materials when they are brought into contact, by virtue of their intrinsic features and by virtue of the contacting conditions. This affinity is responsible for the selective deposition since the application film coating comprising the material B will be deposited only on the material A and not on the remainder of the substrate. A film that would not integrate this common portion could either contaminate, or be entirely deposited on, the whole of the substrate in a nonselective manner, or not be precisely and selectively deposited on the pattern of the printing product since the transfer will not be operational.

By way of nonlimiting illustration, the application film coating may be coated by means of conventional printing techniques, such as photogravure or reverse photogravure, and/or flexography, etc.

Printing Product, Material A—Composition and Properties

An essential feature of the present invention lies in the fact that the printing product comprises a thermoplastic material A, for example a thermoplastic polymer A, and, optionally, a thermosetting material. This printing product pre-printed on the substrate guarantees the design of the future gilt. As a function of its composition, the film will or will not transfer onto the substrate. It is essential for the transfer between the film and the pre-printed pattern to be selective, that is to say only at the level of the pattern (and thus of the pre-printed printing product) favorable to the transfer and not directly on the substrate.

By way of nonlimiting illustration, this printing product may be composed of toner and/or ink and/or a varnish; it may be insulating or conductive depending on the envisioned application.

By way of nonlimiting illustration, in the case of a varnish, the latter may be of solvent-based, aqueous or UV nature. When it is of UV nature, it may be crosslinked by means of an LED and/or of UV radiation.

According to one particular and preferred embodiment of the present invention, the printing product is of UV ink and/or UV varnish type comprising a thermosetting material and also the thermoplastic material A. It is the presence of this thermosetting material which characterizes the fact that the corresponding ink/varnish has a thermosetting behavior. According to one particular and preferred embodiment of the present invention, the pre-printed printing product (and thus the pre-printed pattern) is crosslinked before being brought into contact with the film. This may result in the fact that the polymeric network of the printing product is at its optimum in terms of three-dimensional density by means of the reaction of all the photoinitiator sites. This may also result in a thermosetting behavior, that is to say in the thermosetting portion of the varnish no longer having a glass transition temperature Tg, but only a destruction temperature; thus, this thermosetting polymer present in the varnish will never become soft and will not develop a tacky surface since it will be totally dry to the touch.

Thus, according to certain preferred embodiments of the present invention, the method claimed comprises, after the step of printing the printing product and before the step of applying the film, an activation step (for example by means of UV rays) making it possible to crosslink the printing product (the ink and/or the varnish).

The addition of a thermoplastic material A to the printing product makes it possible to achieve the objectives of selective attachment between the substrate and the film. By way of illustration for an ink and/or a varnish, the selection of a material A, said material A having a chemical nature similar to the material B present in the film application film coating and/or said material A having physical properties (for example Tgs) suited to those of the material B present in the film application film coating, will modify the behavior of the printing product; the latter will become partly thermoplastic since the thermoplastic material A will insert into the polymer network having an initial thermosetting purpose. Thus, during the application of the film on the pre-printed, and preferably pre-crosslinked, printing product, a total and selective transfer will take place by means of the affinity of the materials A and B and by virtue of the contacting conditions. These observations are also applicable when toner is selected in place of inks/varnishes; however, in the particular case of toner, the applicant has noted that the presence of thermosetting material, even if desirable, is not essential for obtaining adhesion between the application film coating and the toner.

A selective deposition of functional layers can thus be carried out by virtue, inter alia, of this affinity between the material A and the material B. Thus, any device manufactured according to the claimed method and comprising these layers of printing products and of film according to the present invention will also be characterized by the existence of an interstitial layer comprising printing product material and film application film coating material.

Thus, according to one embodiment of the present invention, the thermoplastic material A of the printing product
is heat-reactivatable (that is to say that it has a thermoplastic behavior), and
becomes ductile/malleable and develops a surface adhesion property during the step of applying the film in the film-applying station (which is itself heat-reactivatable).

This thus makes it possible to develop a property of surface adhesion between the printing product and the application film coating by virtue of the materials A and B when the treatment temperature (and in particular the temperature of application of the film during the film application step in the film-applying station) is greater than the Tgs of the thermoplastic materials A and B.

In one particular embodiment according to the present invention, the printing product, preferably of ink/varnish type, comprises at least 5% by weight of thermoplastic material A, for example at least 10% by weight, preferably at least 15% by weight. Even though high concentrations of thermoplastic material A can be envisioned, the printing product, preferably of ink/varnish type, will preferably comprise less than 40% by weight, for example less than 30% by weight, preferably less than 25% by weight of thermoplastic material A.

Thus, in one particular embodiment according to the present invention, the printing product, preferably of ink/varnish type, comprises at least 60% by weight, for example at least 70% by weight, preferably at least 75% by weight of thermosetting material.

Thus, in one embodiment of the present invention that is particularly applicable to varnishes/inks, the thermoplastic material A is characterized by a Tg value of less than 60° C., for example less than 50° C., preferably less than 40° C. According to one particular embodiment of the present invention, and as described in greater detail hereinafter in the description, the materials A of the printing product of ink/varnish type and B of the application film coating will be selected such that the Tg of the material A is less than the Tg of the material B.

Since the printing product of ink/varnish type comprises only limited amounts of thermoplastic material A, it is obvious that the Tg of the printing product will, after deposition (and crosslinking), have a value that will be different than the Tg of the thermoplastic material A included in said product. When the printing product is a toner, its thermoplastic material content is generally greater than 50% by weight.

In one particular embodiment of the present invention, the printing product is an ink or a varnish. After deposition/crosslinking, this printed printing product intended to be covered with a gilt foil is in the form of a film coating which is advantageously characterized by a Tg value of between −20° C. and 200° C., for example between 0° C. and 200° C., for example between 10 and 50° C., for example between 15° C. and 40° C.

In one particular embodiment of the present invention, the printing product is a toner. After deposition, for example by electrophotography or xerography, this printed printing product intended to be covered with a gilt foil is in the form of a film coating which is advantageously characterized by a Tg value of between 0° C. and 200° C., for example between 40° C. and 120° C., for example between 50° C. and 120° C., for example between 65° C. and 90° C. In one preferred embodiment of the present invention, when the printing product is a toner, the corresponding printed film coating is characterized by a Tg value of between 40° C. and 70° C.

The measurement of the Tg of the film coating of the printed/(crosslinked) printing product (varnish/ink/toner) will advantageously be carried out by means of the DSC method indicated above in the description—the sample used for the measurement may advantageously originate from the material constituting the printing product after printing and crosslinking. According to one particular embodiment of the present invention, and as described in greater detail hereinafter in the description, the printing product and the application film coating will preferably be characterized in that the Tg of the printing product is less than the Tg of the application film coating.

Printing of the Pattern—Conditions

The present invention is thus characterized in that the method claimed makes it possible to obtain a substrate comprising the film application film coating selectively co-adhered to the pattern printing product and thus forming, by virtue of the film coating of functional material, the traces of functional material according to said pattern. Said pattern (of the printing product) may be printed by any appropriate method. By way of nonlimiting illustration, mention will be made of screen printing, inkjet printing, electrophotography or xerography, etc. According to one particular and preferred embodiment of the present invention, the printing product is printed digitally, for example by inkjet printing or electrophotography or xerography printing, preferably by inkjet printing. This inkjet printing makes it possible to print, in relief, areas intended to be optionally covered, depending on the composition of the printing product and more particularly on the presence or absence of the material A, with the film coating of functional material (for example the gilt film). The gilt will thus be deposited selectively. Inkjet printing of varnish/ink is well known to those skilled in the art. Electrophotography or xerography printing of toner is also well known to those skilled in the art.

The areas (and thus the pattern) may advantageously be any kinds of forms, for example printed circuits, points, letters and/or any other geometric forms of any kind; they may consist of various materials, for example of inks and/or varnish and/or toner.

The thickness of the printing product printed may advantageously be very variable; by way of nonlimiting illustration, mention will be made of thicknesses of between 5 µm and 200 µm.

In fact, the relief of the patterns and therefore of the areas intended to be covered with a gilt foil preferably represents a thickness of about one micron, preferably greater than five microns, or even greater than ten microns. This thickness—of any material whatsoever previously deposited on the substrate; for example of the varnish and/or of the ink—is generally less than one millimeter for relief printing. However, the present invention could also apply to substrates having been printed by 3D technology, for example by means of inkjet (and/or varnish) printing with successive layers and thus having thicknesses that can range up to several centimeters, for example less than 2 cm.

The substrate may be selected from a large number of materials and cannot be considered to be limited to the materials frequently used in standard printing and/or customizing devices, such as paper, cardboard and plastic substrates. By way of nonlimiting examples, mention will be made of metal, paper, nonwoven fabric, plastic, for example a methacrylic copolymer resin, polyester, polycarbonate, polyethylene, polypropylene, and/or polyvinyl chloride, or even materials of cellulose-based type such as, for example, wood, plywood or crystalline materials such as glass or ceramics, for example complex materials comprising one or more of these components, such as for example milk cartons.

According to the present invention, the substrate (foil, card, etc.) generally has a rectangular or square shape. This foil moves, generally by virtue of a system for transporting substrates in a printing machine, along a path of transport oriented along a longitudinal axis from at least one entry magazine supplying the printable and/or customizable substrates, to at least one exit magazine receiving the substrates that have been printed and/or customized, and that are thus covered with the traces of functional material in accordance with the present invention. The "lateral edges" of the substrate are the two edges located on either side of this longitudinal axis; the front and/or back edges are its transverse edges. The substrate may also be in the form of a roll in a machine of roll-to-roll type.

Application of the Film

The step of applying the film on the substrate under pressure and temperature conditions which lead to selective co-adhesion between the printing product and the film application film coating (in particular between the material A of the printing product and the material B of the film application film coating) can be carried out according to any appropriate method. By way of illustration, mention will be made of the use of one or more plates which press the film onto the substrate;

of one or more sets of pinching rollers as described in FIG. 1;

of one or more pressing rollers as described in FIG. 2.

This step is thus essential since it conditions the positioning of the traces of functional material on the substrate.

The pressure and temperature conditions will thus be advantageously selected as a function of the materials A and B respectively used in the printing product and in the application film coating.

By way of illustration, the film application temperature is advantageously located between 0° C. and 200° C., for example between 70° C. and 190° C., for example between 110° C. and 150° C. In one particular embodiment of the present invention, the film application temperature will also be selected as a function of the contact time during which the printing product and the application film coating are brought into contact and heated. Since it is attempted to promote relatively short contact times (for example less than one second), it has been noted that the film application temperature must advantageously be at least 25° C. higher than the highest Tg of the application film coating and of the varnish/ink/toner film coating, for example at least 40° C. higher than this Tg, or even at least 60° C. higher than this Tg; these observations and the Tgs of the application film coating and of the varnish/ink/toner film coating result in favoring a film application temperature of between 130° C. and 170° C.

The present invention is also described in an illustrative manner and according to one of its embodiments in FIG. 3. It is possible to see therein, on the left-hand portion of the figure, a gilding group in accordance with the present invention and which is downstream of the printing station represented on the right-hand portion of the figure. The substrate thus moves from right to left. By way of illustration, the substrate may advantageously consist of paper, flat cardboard, corrugated and/or microcorrugated cardboard and/or plastic. It may be in roll-to-roll or foil-to-foil form.

When the substrate passes under the printing station which may be a roll, a screen-printing screen, and/or inkjet heads, etc., the desired pattern is printed by a varnish/an ink or toner containing the material A. In the case of inkjet heads, the varnish must be suitable for this type of application by having a very low viscosity. The printed thickness may advantageously range from 5 μm to 100 μm in the majority of cases; it may nevertheless easily reach several hundred microns.

Subsequently, the printed pattern (for example ink/varnish) is crosslinked to the maximum of its three-dimensional density permitted by its structure and its reaction sites; this can be carried out by a drying means (as represented in the center of the figure) such as a means of physical, IR, UV radiation, LED, etc., drying. The printed pattern is in general, after this drying/crosslinking step, not surface-tacky.

The gilding group in this illustration consists of at least two rollers (preferably motorized), installed opposite one another, rotating for example in opposite directions, and the distance of which is adjustable so as to adapt to various substrate thicknesses; according to one preferred embodiment of the present invention, this adjustment will take into account not only the thickness of the substrate, but also the thickness of the printing product (for example of the ink and/or of the varnish) previously printed onto the substrate and also, optionally, taking into account the thicknesses of the film and thus of the film coatings of the gilt foil deposited by the gilding group. According to one particular embodiment of the present invention, the gap between the opposing rollers may be motorized and dynamically controlled. According to one particular and preferred embodiment of the present invention, the surface of the upper roller is different than that of the lower roller; in particular, the surface of the upper roller is more compressible than that of the lower roller. By way of illustration, the upper roller has at the surface a compressible material which allows it to closely conform to the shape of the printed pattern of the printing product, whereas the lower roller will consist of a harder, for example incompressible, material. According to one particular embodiment of the present invention, the upper roller comprises a heating device (or even a cooling device depending on the Tg values) making it possible to reach not only the glass transition temperatures Tg of each of the materials A and B, but also the glass transition temperatures Tg of the printed/(crosslinked) printing product and of the film coating for application of the gilt film.

According to one particular embodiment of the present invention, the gilding (or film-applying) group operates with a linear speed (at the surface of the rollers) greater than or equal to the speed of the substrate under the printing station so as not to slow down the machine.

The gilding group-controlling features are given hereinafter by way of illustration: adjustable pressure (for example from 1 to 10 bar, preferably with an operating pressure of greater than 1 bar), and/or adjustable speed; and/or adjustable temperature (for example a maximum operating temperature of 250° C., for example between 0° C. and 200° C., for example between 70° C. and 190° C., for example between 130° C. and 170° C., for example between 110° C. and 150° C., for example between 120° C. and 140° C.); and/or hardness of the coating of the upper roller of between 50 and 95 Shore A.

The passing of the printed (and crosslinked) pattern under the rollers will make it possible to heat the pre-printed pattern containing the material A above the Tg of the material A and of the crosslinked printing product comprising said material A. The thermoplastic nature of the material A will allow a softening thereof. The same is true for the material B of the application film coating. The two materials thus softened may be considered as "open", thus allowing the adhesion of an analogous material. The free groups (for example hydroxylated groups) of each material and also the unsaturations will develop chemical bonds of covalent type between the materials. Thus, the attachment of the material B to the material A will be promoted while at the same time avoiding any attachment of the application film coating to the non-pre-printed portions of substrate. The deposition will thus be referred to as "selective".

In one particular embodiment according to the present invention, the detachment of the foil (of the film) from the substrate is ideally carried out when the film is still hot so as to be under the best possible transfer conditions. The presence of an open angle during the peeling of the film makes it possible to obtain good fineness while avoiding poorly defined contours.

A particular film composition that may advantageously be used in the context of the present invention is described below by way of nonlimiting illustration.

A transport layer consisting of PET with a thickness preferably of between 15 μm and 24 μm (for example of 19 μm), which represents the best compromise between the mechanical properties and its ability to conduct heat during the application of the film.

A release film coating advantageously consisting of wax, for example of a carnauba-type natural wax with a melting point preferably of between 60° C. and 110° C. (for example around 85° C.). Thus, according to the conditions previously stated, when the film application temperature reaches 120-140° C. during the deposition, the wax will be vaporized. Since said wax is the very thin (nanometric scale) link between the layers of the film, the state conversion thereof will induce a release of the transport layer with respect to the remainder of the film.

The protective film coating may advantageously be composed of hydroxylated acrylic polymers of PMMA type and derivatives. The technology is most commonly based on the two-component reaction of the hydroxylated polymers with resins comprising isocyanate groups. This reaction will make it possible to densify the polymeric network for the purpose of improving the mechanical strength and chemical resistance properties. In order for this layer to be conductive, polymers of PEDOT:PSS type are advantageously introduced into the matrix (see example below).

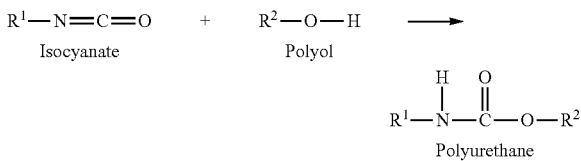

With $R^1$ and $R^2$ being more or less long hydrocarbon-based chains.

A composition of 50% of PMMA acrylic, 20% of isocyanate and 30% of PEDOT:PSS is a good balance in order to obtain the intended strength/resistance and conductivity properties.

The film coating of functional material can have several natures. The most effective example is a metallic nature. Aluminum remains a choice of best compromise between performance and price with respect to silver and copper. The functional material may be composed of a deposit of aluminum of approximately 1 µm deposited by a PVD technique. This vacuum evaporation method is a thin-layer deposition technique; the vaporized material will come to be uniformly deposited on the film/substrate. The resistance value obtained for this film coating of functional material may advantageously be between 0.3Ω and 10 kΩ. The thickness of the film coating of functional material will be selected as a function of the desired applications; the applicant has managed to develop its method with functional material film coating thicknesses ranging from 50 nm to about 1 micron. Thicknesses of more than 100 nm, for example of more than 150 nm, 200 nm, 300 nm, 400 nm, 500 nm were advantageously produced and tested in the context of the present invention. Thus, as explained below in the chipless radio-frequency identification (RFID) tag application, the obtaining of functional material film coating thicknesses of greater than 250 nm, or even greater than 400 nm or even 500 nm has opened up the route to these new applications.

The application film coating (comprising and/or consisting of the material B) can advantageously be composed of hydroxylated acrylic and polyester resins, and also of nitrocellulose and of fillers. The advantage of the acrylic and polyester resins being hydroxylated and/or carboxylated is the creation of attachment sites promoting chemical bonds with a contacting interface of material A type (originating from the printing product). An effective formula may be composed of 40% of hydroxylated acrylic resin, 30% of hydroxylated polyester resin, 20% of nitrocellulose and 10% of silica-type fillers (percentage by weight). The final formula will preferably be a solvent phase with a solids content of between 15% and 30% by weight applied by rotogravure. It is judicious to obtain a Tg of the material B in a range of between 40 and 80° C.

The printing product can advantageously be a UV inkjet varnish. Its main characteristic is a low viscosity of between 5 mPa·s and 70 mPa·s, for example between 10 mPa·s and 50 mPa·s. It may be composed of several monomers such as dipropylene glycol diacrylate (DPGDA), or trimethylolpropane triacrylate (TMPTA), the monomer portion preferably representing at least 50% by weight of the composition of the printing product, for example 60% by weight. The photoinitiator portion which makes it possible to initiate the crosslinking is preferably between 10% and 25% by weight of the composition of the printing product, for example about 20% by weight; it is advantageously composed of alpha-hydroxycyclohexyl phenyl ketone and of alpha-hydroxyketone. The material A is preferably between 15% and 30% by weight of the composition of the printing product, for example 20% by weight; it may be a hydroxylated acrylic resin, the Tg of which is quite low, for example less than 50° C., for less than 40° C. or even less than 20° C.

The objective is thus to reactivate both the printed/(crosslinked) printing product and also the application film coating at the time they are brought into contact by exceeding their respective temperature Tg; this makes it possible to generate attachments between the two materials and to allow the desired adhesion, for example by virtue of the hydroxyl groups of the resin of the material A and of the material B.

In one particular embodiment relating to the varnishes/inks, the printed/crosslinked printing product is first reactivated as soon as the temperature increase reaches the Tg of said printed/crosslinked printing product; then, the temperature reaches the Tg of the application film coating, which allows adhesion between the printing product and the material B of the application film coating.

Material A and Material B Interactions

An abovementioned temperature range makes it possible to slightly soften the materials A and B, and in particular the printing products and the application film coating, by means of exceeding their respective glass transition temperature Tg. These conditions will be selected to allow the creation of chemical bonds between the materials A and B and therefore the improved and selective attachment between the substrate and the film; these conditions will also be controlled so as to avoid any temperature excursion/increase, thereby making it possible to prevent

- the material B present in the application film coating (and also the film coating itself) from becoming too sticky/molten; which makes it possible to prevent any adhesion of the application film coating directly on the substrate in the non-pre-printed areas of printing product comprising the material A,
- the material A (and also the printed/crosslinked printing product itself) from becoming too sticky/molten; which makes it possible to prevent the printing pattern from losing its fineness and creating traces of functional material that are too large and therefore unsuitable for certain uses such as printed electronics.

According to one particular embodiment of the present invention, which embodiment is particularly relevant for varnishes/inks, the materials A of the printing product and B of the application film coating will be selected such that the Tg of the material A (Tg[A]) is less than the Tg of the material B (Tg[B]); preferably, Tg[A] will be less than 0.9 Tg[B], or even less than 0.8 Tg[B], for example less than 0.7 Tg[B], for example less than 0.5 Tg[B].

According to one particular embodiment of the present invention, which embodiment is particularly relevant for varnishes/inks, the materials A of the printing product and B of the application film coating will be selected such that the Tg of the (printed/crosslinked) printing product containing the material A is less than the Tg of the application film coating containing the material B; preferably, Tg ((printed/crosslinked) printing product) will be less than 0.95 Tg (application film coating), or even less than 0.9 Tg (application film coating), for example less than 0.85 Tg (application film coating).

According to one particular embodiment of the present invention, which embodiment is particularly relevant for toners, the materials A of the printing product and B of the application film coating will be selected such that the difference in temperature between the Tg of the (printed) printing product containing the material A and the Tg of the application film coating containing the material B is less than 30° C., this being, for example, in a range of temperature values of between 35° C. and 75° C.

According to one particular embodiment of the present invention, the materials A of the printing product and B of the application film coating will be selected such that they have an identical chemical nature; by way of nonlimiting illustration, this chemical nature will be selected from a nucleophilic group (comprising oxygen and/or nitrogen), a hydroxyl group and/or a nitrogenous group. This will promote the creation of chemical bonds of covalent type greater than 200 kJ/mol between the atoms in order to promote the adhesion between the surfaces of the printed/crosslinked printing product and of the application film coating.

According to one particular embodiment of the present invention, the applicant has discovered, unexpectedly, that it is possible to optimize the deposition performance levels of its method by controlling the temperature of the printing product after printing and before application of the film.

Thus, in one preferred embodiment according to the present invention, one or more of the conditions mentioned below is applied to the method claimed the temperature of the printed printing product between the step of printing said product and the step of applying the film is maintained at a value of greater than 35° C., for example greater than 40° C., preferably greater than 45° C.; and/or the temperature of the printed and crosslinked printing product between the step of crosslinking said printed product and the step of applying the film is maintained at a value of greater than 35° C., for example greater than 40° C., preferably greater than 45° C.

However, even though this does not represent a preferred embodiment, it is obvious that the method according to the present invention also covers the case where the step of applying the film would be carried out in a manner that is shifted (in time or spatially) relative to the step of printing the printing product.

According to one particular embodiment of the present invention, the method claimed comprises a method for depositing traces of conductive functional material which also comprises a method for printing insulating traces in a single pass in the printing machine. Thus, the method claimed comprises not only the printing of a pattern of first printing product comprising the material A in accordance with the objectives of attachment of an application film coating and therefore of conductive functional material mentioned above, but also the printing of a second printing product different than the first printing product used; this second printing product will be selected in such a way as to confer on it an insulating property in terms of electrical conduction. Beyond its insulating property, the second printing product will be selected in such a way as to prevent any attachment with the film application film coating; thus, by way of illustration, the second printing product preferably contains neither the material A, nor any other material similar to the material A in terms of chemical nature and/or physicochemical properties so as to avoid affinity with the material B of the application film coating. By way of nonlimiting illustration, the second printing product will be selected from thermosetting varnishes (or varnishes intended to be thermosetting), preferably UV-thermosetting varnishes—they will additionally preferably be free of any thermoplastic polymer with a Tg equal to or less than the temperature of application of the film on the substrate. This type of method, by virtue of the use of a (conductive and/or insulating) foilable varnish and a (conductive and/or insulating) non-foilable varnish, opens up an advantageous field of application for printed electronics with the possibility of printing insulating and/or conductive traces in one pass in the printing machine depending on client requirements.

Conductive Inkjet in Series

According to one particular embodiment of the present invention, the method claimed comprises not only a step of printing a pattern, followed by the step of depositing traces of functional material according to said pattern, but it also comprises a subsequent additional step of inkjet printing of conductive printing product at least partly on the traces or exclusively on said traces of functional material deposited. Thus, by way of illustration, the present invention also makes it possible to add a conductive inkjet varnish at the surface of the conductive trace after the application of the film coating of functional material. There are multiple advantages to this conductive varnish since it will make it possible to preserve a high conductivity while at the same time providing the mechanical strength and chemical resistance properties of a surface varnish. It integrates fully into the problems that can be observed in the printed electronics field.

This additional printing product can advantageously be selected from varnishes composed of conductive polymers such as polypyrrole, polyaniline, PEDOT:PSS, polyacetylene and derivatives thereof, etc. The addition of metal or carbon-based fillers in order to improve this conductivity is also possible. By way of illustration, mention will also be made of conductive inks based on conductive nanoparticles such as silver, copper and/or gold nanoparticles.

These conductive compounds may be of various solvent-based, aqueous or UV natures; the drying thereof may also be by UV or LED radiation or by thermal or IR drying.

Chipless RFID Tag

The method described and claimed in accordance with the present invention has proved to be particularly attractive and efficient for printed electronics and, in particular, for the fabrication of chipless radio-frequency identification (RFID) tags (also referred to as RFID tags) and, in particular, radio-frequency identification tags characterized by the generation of an identification code that can be read by an electromagnetic-wave emitter-receiver. This type of chipless RFID tag therefore requires neither an integrated circuit nor discrete electronic components, such as for example a transistor and/or a coil and/or a capacitor and/or an antenna. By way of illustration, mention will be made of the fabrication of a chipless RFID tag comprising a particular geometry of conducting pathways made by means of the method described and claimed in accordance with the present invention (with the film coating of functional material which is electrically conductive); this particular geometry of electrically conductive pathways will, by way of illustration, consist of a plurality of separate parallel conductive strips formed on a dielectric support, in which conductive bridges connect together neighboring conductive strips, the conductive bridges delimiting, between the conductive strips, portions of dielectric strips of distinct lengths, each dielectric strip portion determining a resonance frequency of the tag, all of the resonance frequencies of the tag defining an identification code that can be read by an electromagnetic-wave emitter-receiver. In one preferred example of implementation, the geometry of the conductive pathways will thus advantageously be made on any substrate by means of a technology of contactless printing (for example digital inkjet printing of ink/varnish, for example by means of piezoelectric-type printing heads, or digital printing of toner by electrophotography or xerography) of the printing product (which is for example insulating), followed by electrically conductive functional material gilding technology. The abovementioned bridges and strips will thus advantageously be made by means of the same gilt foil. In one particular embodiment according to the present invention, the fabrication of a chipless RFID tag according to the method claimed will be characterized by a thickness of the film coating of conductive functional material (for example copper and/or silver) of greater than 100 nm, for example of more than 150 nm, 200 nm, 250 nm, 300 nm, 400 nm, or even of more than 500 nm; and/or by a thickness of the film coating of conductive functional material (for example copper and/or silver) of less than 2 microns, for example of less than 1.5 microns, or even of less than 1 micron; and/or by a thickness of the film coating of printing product (ink/varnish/toner) deposited (measured just before the bringing into contact with the film) of greater than 3 microns, for example of more than 10 microns; and/or by a thickness of the film coating of printing product (ink/varnish/toner) deposited (measured just before the bringing into contact with the film) of less than 200 microns, for example of less than 100 microns.

It is understood from the aforementioned that the present invention also relates to at least one printing and/or customizing device (or system) comprising means for carrying out at least one of the methods described in the present application. By virtue of the functional considerations provided in the present application, it is understood that such systems or devices comprise means for accomplishing the functions described with reference to the method and that it is not necessary to detail these means.

The present application describes various technical features and advantages with reference to the figures and/or to various embodiments. Those skilled in the art will understand that the technical features of a given embodiment can in fact be combined with features of another embodiment unless explicitly mentioned otherwise or unless it is obvious that these features are incompatible or that the combination does not provide a solution to at least one of the technical problems mentioned in the present application. Furthermore, the technical features described in a given embodiment can be isolated from the other features of this embodiment unless explicitly mentioned otherwise.

It should be obvious for those skilled in the art that the present invention allows embodiments in numerous other specific forms without distancing it from the field of application of the invention as claimed.

Consequently, the present embodiments should be considered by way of illustration, but can be modified in the field defined by the scope of the appended claims, and the invention should not be limited to the details given above.

What is claimed is:

1. A method for depositing traces of functional material on a substrate in a printing machine comprising a printing station followed by a film-applying station, comprising the following steps:
   a. providing the substrate,
   b. printing, in the printing station, a printing product according to a pattern on the substrate,
   c. providing a film comprising at least one application film coating comprising a material B, a film coating of functional material and a transport layer,
   d. applying, in the film-applying station, the film onto the substrate under pressure and temperature conditions leading to the selective co-adhesion between the pattern printing product and the application film coating,
   e. removing the film from the substrate,
      e. 1. the substrate comprising the application film coating co-adhered to the pattern printing product and thus forming the traces of functional material according to said pattern,
      e. 2. the remainder of the film coating of functional material, and preferably of the application film coating, being recovered with the film removed, wherein
   the printing product comprises a thermoplastic material A,
   the material B of the application film coating is thermoplastic,
   the materials A and B each have a glass transition temperature Tg, and
   that the conditions of step d are such that the Tgs of each of the materials A and B are achieved and that chemical bonds are created between the materials A and B.

2. The method as claimed in claim 1, wherein the printing product is a UV ink and/or a UV varnish and in that it comprises a thermosetting material.

3. The method as claimed in claim 2, wherein the printing product is crosslinked after printing and before application of the film.

4. The method as claimed in claim 3, wherein after deposition/crosslinking, this UV varnish and/or UV ink forms a film coating which is characterized by a Tg value of between 0° C. and 200° C.

5. The method as claimed in claim 1, characterized in that the printing product is a toner.

6. The method as claimed in claim 5, wherein after deposition, this toner forms a film coating which is characterized by a Tg value of between 0° C. and 200° C.

7. The method as claimed in claim 1, wherein the application film coating comprises at least 50% by weight of the thermoplastic material B.

8. The method as claimed in claim 1, wherein the thermoplastic material B is characterized by a Tg value of between 0° C. and 200° C.

9. The method as claimed in claim 1, wherein the application film coating is characterized by a Tg value of between 40° C. and 80° C.

10. The method as claimed in claim 1, wherein the step of applying, in the applying station, the film onto the substrate is carried out at an application temperature of between 70° C. and 190° C. or between 130° C. and 170° C.

11. The method as claimed in claim 1, wherein the functional material of the film coating of functional material is electrically conductive.

12. The method as claimed in claim 1, wherein the functional material of the film coating of functional material comprises copper and/or silver, and/or tin and/or chromium and/or gold and/or aluminum, and/or conductive alloys.

13. The method as claimed in claim 1, wherein the film coating of functional material has a thickness of at least 200 nm or at least 500 nm.

14. The method as claimed in claim 1, wherein the film comprises a release film coating included between the film coating of functional material and the transport layer.

15. The method as claimed in claim 14, wherein the release film coating comprises electrically conductive material.

16. The method as claimed in claim 1, wherein the film comprises a protective film coating included between the film coating of functional material and, either the transport layer, or a release film coating included between the film coating of functional material and the transport layer, said protective film coating comprising electrically conductive material.

17. The method as claimed in any claim 1, wherein the film does not comprise a protective film coating for the film coating of functional material.

18. The method as claimed in claim 1, wherein the printing of the printing product is relief printing of the printing pattern carried out by inkjet printing.

19. The method as claimed in claim 1, further comprising printing insulating traces in a single pass in the printing machine.

20. The use of the method as claimed in claim 1, for the fabrication of chipless radio-frequency identification (RFID) tags further comprising generation of an identification code that can be read by an electromagnetic-wave emitter-receiver.

* * * * *